United States Patent [19]
Labarre et al.

[11] Patent Number: 5,119,017
[45] Date of Patent: Jun. 2, 1992

[54] BANDWIDTH ANALYSIS SYSTEM AND METHOD

[75] Inventors: Gary K. Labarre, Lineboro; Timothy E. Gee, Parkton, both of Md.

[73] Assignee: Westinghouse Electric Corp., Pittsburgh, Pa.

[21] Appl. No.: 597,917

[22] Filed: Oct. 12, 1990

[51] Int. Cl.$^5$ ............................................. G01R 23/16
[52] U.S. Cl. .............................. 324/77 B; 324/78 D; 324/79 D; 364/485
[58] Field of Search ............... 364/485, 487; 382/29, 382/11, 17, 64; 324/77 R, 77 A, 77 B, 78 R, 78 D, 79 D

[56] References Cited

U.S. PATENT DOCUMENTS

| | | | |
|---|---|---|---|
| 4,034,362 | 7/1977 | Balanca | 382/29 |
| 4,611,164 | 9/1986 | Mitsuyoshi | 324/77 B |
| 4,761,604 | 8/1988 | Engelson | 324/77 B |
| 4,801,873 | 1/1989 | Takano | 324/77 B |
| 4,901,082 | 2/1990 | Schreiber | 342/89 |
| 4,947,338 | 8/1990 | Vistica | 324/77 B |

Primary Examiner—Kenneth A. Wieder
Assistant Examiner—Jose M. Solis
Attorney, Agent, or Firm—J. K. Williamson

[57] ABSTRACT

The present invention is a system and method that uses a digital spectrum analyzer to digitize a spectrum and loads the digitized spectrum into a computer. The computer scans the spectrum to determine a zero dB reference by cyclic averaging and determines the upper and lower cutoff frequencies using inward and outward scan techniques which are averaged. During zero dB level determination holes in the spectrum are ignored and during upper and lower cutoff frequency determination the holes or drop outs in the spectrum are located, counted and characterized.

24 Claims, 13 Drawing Sheets

BANDWIDTH ANALYSIS SYSTEM AND METHOD

BACKGROUND OF THE INVENTION

1. Field of the Invention

The present invention is directed to a system that analyzes and characterizes the bandwidth of an input signal and, more particularly, to a system which will measure the bandwidth of input signals and locate and quantify holes and/or drop outs within that bandwidth in a high noise environment.

2. Description of the Related Art

Bandwidth measurements have been performed for many years in the fields of radar and communication system testing. Various techniques have been developed to automate the measurement of signal bandwidths utilizing a spectrum analyzer or scaler network analyzer to obtain a digitized representation of the signal bandwidth. Several systems have been developed to allow a computer to process the digitized data and determine the signal bandwidth. These algorithms vary in complexity from a simple "three dB down from maximum" technique to complex special case techniques. The simple solutions are rarely adequate because they require a very flat, noise free sample where the edges are well defined, while the special case solutions are rarely adequate to handle the wide range of requirements imposed by general purpose testing. The Hewlett Packard HP 8566B spectrum analyzer includes a bandwidth measurement algorithm which requires a relatively clean signal. This system will not accurately measure the bandwidth in the presence of holes or drop outs in the signal spectrum. U.S. Pat. No. 4,794,324 is directed to a technique that allows a computer to control a spectrum analyzer over an IEEE-STD-488 bus to make bandwidth measurements. The technique of the U.S. Pat. No. 4,794,324 was developed to measure noise type signals utilizing the maximum hold feature of the spectrum analyzer. However, the technique described in the U.S. Pat. No. 4,794,324 requires multiple samples, works for bandpass signals only, does not work in the presence of holes or drop outs in the spectrum and does not work for multiple bandwidths. As a result of the deficiencies in the prior art spectrum analyzers, the test personnel would resort to manual examination of the spectrum analyzer screen, so that quite often the speed, validity and repeatability of the manual test results depends upon the skill and thoroughness of the operator. Since the presence of a signal spectrum with holes and/or drop outs is becoming more and more prevalent in the state of art communications and radar equipment now being tested and, in the face of growing concern over test speed and validity, a method of automatic bandwidth analysis which will handle high noise environments with holes and/or drop outs is needed.

SUMMARY OF THE INVENTION

It is an object of the present invention to provide a bandwidth analysis system that does not require specific knowledge of the instrument providing the data and only requires generic parameters describing the expected bandwidth, the holes and the data set.

It is another object of the present invention to support generic spectrum input signals.

It is a further object of the present invention to provide spectrum measurements for bandwidth, center frequency, maximum power, frequency at maximum power, minimum power, frequency at minimum power, upper cutoff frequency, lower cutoff frequency, zero dB point, ripple, signal rejection and hole count, and for each hole the center frequency, the width and the depth.

It is also an object of the present invention to allow the user to program the filtering capability for noise and hole immunity.

It is another object of the present invention to only require one sample of the signal to provide a complete characterization.

It is another object of the present invention to provide a bandwidth measurement system that uses actual measurement data and does not rely on preprogrammed levels to determine bandwidth parameters.

The above objects can be accomplished by a system and method that digitizes the spectrum and loads the digitized spectrum into a computer. The computer scans the spectrum to determine characteristics such as bandwidth by determining a zero dB reference and determining the upper and lower cutoff frequencies using two techniques which are averaged. During upper and lower cutoff frequency determination the holes or drop outs in the spectrum are located, counted and characterized.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
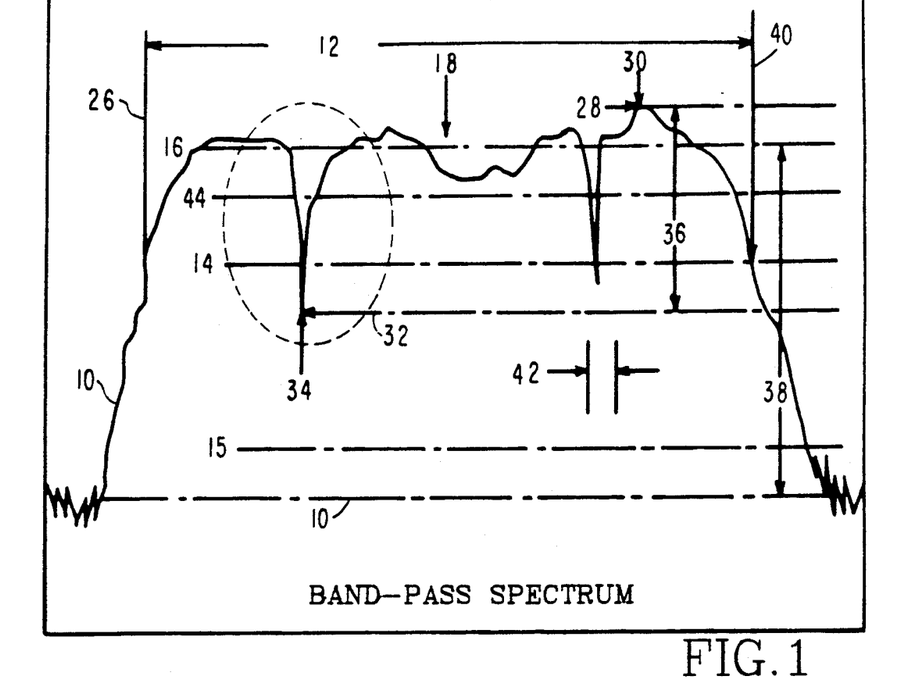
FIG. 1 illustrates a band-pass spectrum and the characteristics of such a spectrum measured by the present invention.
Figure 2:
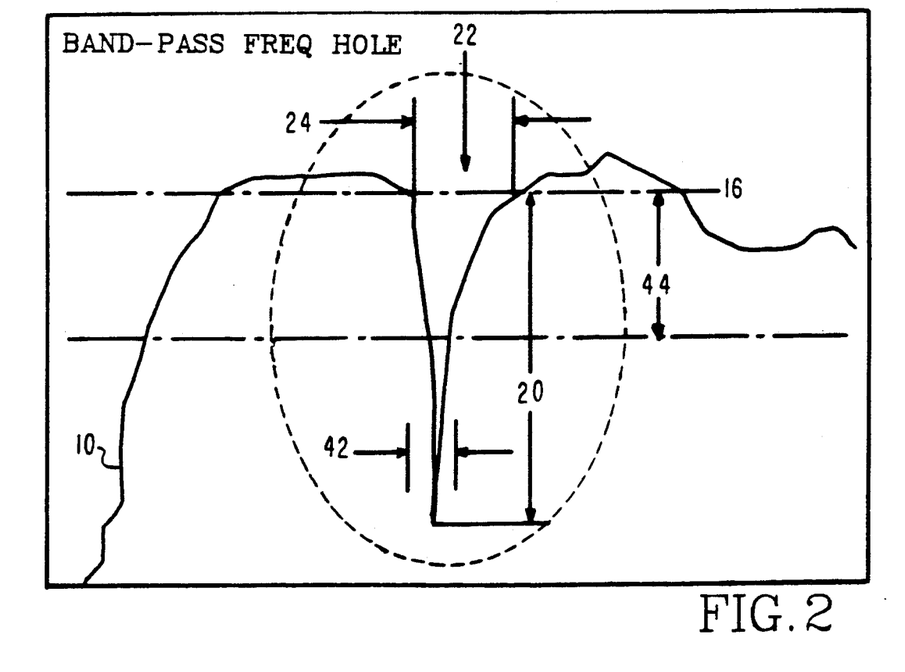
FIG. 2 illustrates a band-pass spectrum hole and the characteristics of the hole measured by the present invention.
Figure 3:
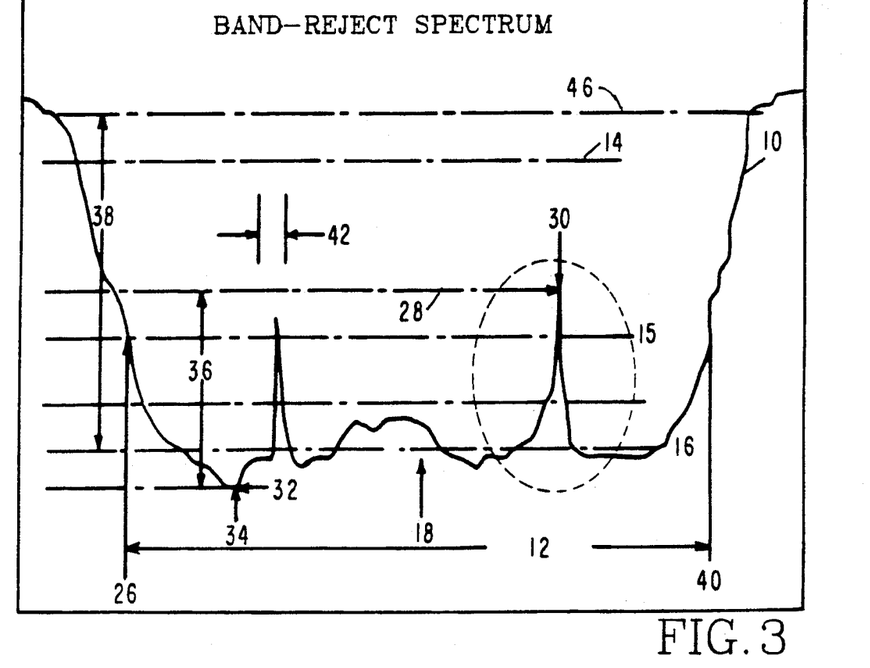
FIG. 3 illustrates a band-reject spectrum and the characteristics, measured by the present invention.
Figure 4:
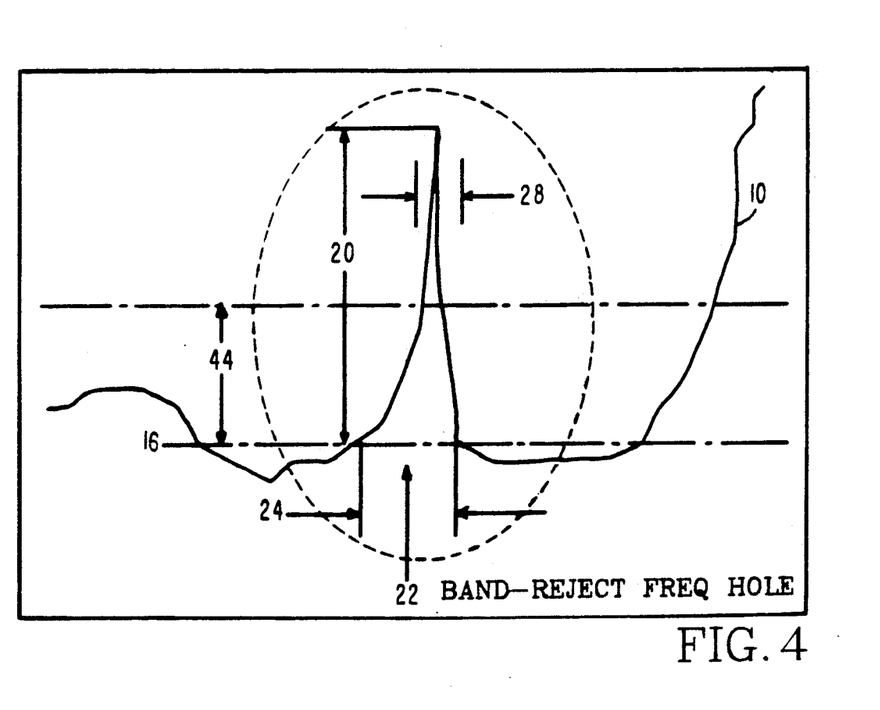
FIG. 4 illustrates a band-reject hole and the characteristics of the hole measured by the present invention.

FIG. 1 illustrates a typical band-pass spectrum and the characteristics of the spectrum which the present invention can determine along with the characteristics of the analysis filters which can be set to ignore noise in the spectrum being analyzed. The present invention determines the bandwidth as the width in frequency of the spectrum at the specified cutoff level either for band-pass or band-reject at the specified dB value away from the zero dB point. The present invention determines the center frequency of the spectrum as the midpoint of the measured bandwidth. A hole count is determined which is the number of frequency holes encountered in the bandwidth measurement that match the hole definition provided by the user in the set up parameters to be discussed later. Hole data in the form a record for each hole found is provided by the present invention and consists of the hole depth, which is the amplitude in dB from the zero dB point, the hole center frequency, which is the midpoint frequency of the hole, and the hole width, which is the frequency width of the hole measured at the zero dB point. If desired this information can be used to rescale the measurement device and zoom in on any frequency hole. The lower cutoff frequency is also determined as the frequency at the left edge of the measured band. The maximum power of the spectrum is determined as the value of the maximum power found inside the measured bandwidth and the frequency of the maximum power is the frequency where the maximum power is located. The minimum power value is also found for the power inside the measured bandwidth as well as the frequency of the minimum power which is the frequency where the minimum power is located. Bandwidth ripple is determined as the minimum to maximum power deviation across the top of the bandwidth measurement in the frequency domain. The maximum hole depth will be included in the ripple value. The difference between the average power level inside the bandwidth and the average power outside the bandwidth is calculated as the signal rejection level. However, if a cutoff level rejection value is provided, all points outside that value are used to determine the average power outside of the bandwidth. The upper cutoff frequency or frequency at the right edge of the bandwidth is determined. The zero dB point is determined as the average value of the top of the measured band and is used, as previously discussed, in many other bandwidth measurements.

To determine the spectrum characteristics as discussed above, the user must supply several expected signal characteristics as well as information about the instrument being used. Device data which is a description of the instrument used to collect the data, its state at the time of measurement and the array of digitized data are provided by the user. The device data includes a starting cell location which is usually 1, the ending cell location which is usually the maximum number of cells on the time axis that the device is capable of digitizing. Both the horizontal (seconds/cell) and vertical (power/cell) increments along with horizontal (time) and vertical (power) values of the initial vertical and horizontal values are also provided as device data. The horizontal and vertical cells per division which indicates the resolution of the screen are provided as device data. Combining all of the above device data information, it is possible to determine the relative time and voltage of each individual cell location which is used to initialize the routines to be discussed in more detail later. The array of digitized data should be preconditioned if needed (that is, checked for off scale, smoothing applied, etc.) and integerized, if possible, so that the minimum power possible has a value of one and the maximum power has a value equal to the number of cells possible in the vertical direction. This can be accomplished by the spectrum analyzer operator adjusting the scale of the spectrum analyzer display so that the spectrum is as large as possible and centered on the display. The cutoff level should be provided which is the power level from the measured zero dB point from which the bandwidth is measured. This value needs to be provided for a pass band spectrum or a reject band spectrum as appropriate. This value defaults to 3.0 dB if no value is entered. A minimum hole width in cycles per second can be entered and any holes narrower than the minimum hole width will be filtered out and not counted as holes. The default is 2% of the sample bandwidth. The minimum hole depth down from the zero dB point must be supplied and any hole less than the minimum hole depth down from the zero dB point will be filtered out and not counted as a hole. The minimum hole depth defaults to 3.0 dB if no value is entered, however, the default could be the cutoff power point. To qualify as a hole both the minimum hole depth and minimum hole width criteria must be satisfied. The user must also enter the bandwidth type for the given frequency spectrum either band-pass or band-reject.

Figure 5:
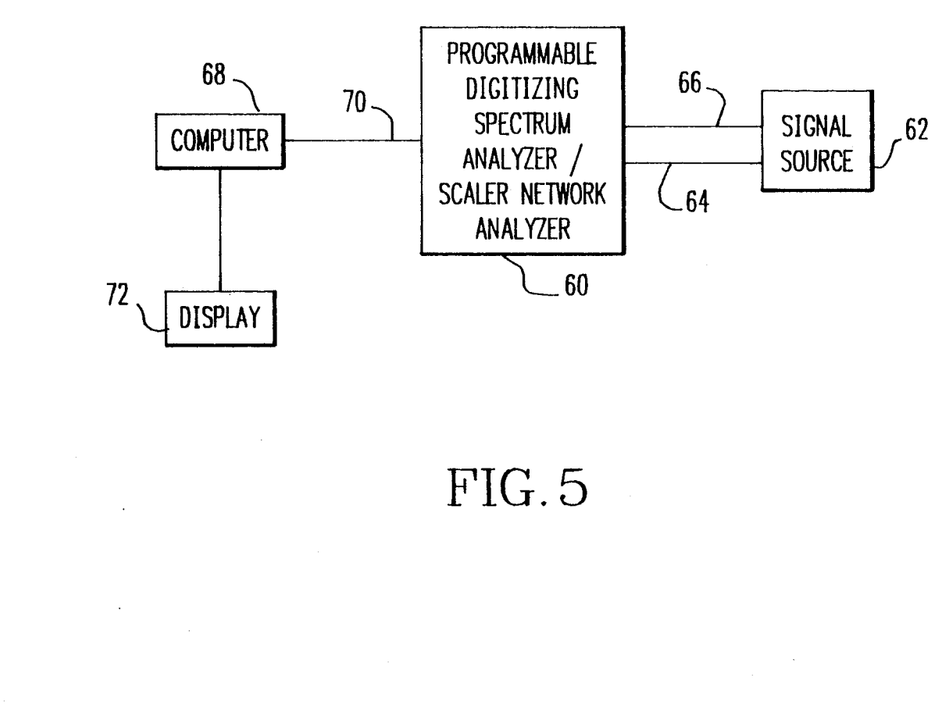
FIG. 5 illustrates the system of the present invention.

The present invention as illustrated in FIG. 5 includes a programmable digitizing spectrum analyzer 60 such as the Hewlett Packard 8566B or a programmable scaler network analyzer such as the Hewlett Packard 8757A or a Wavetek 8003 scaler network analyzer connected to a signal source 62 by a signal line 64 and a trigger line 66. The digitizing analyzer 60 is connected to a computer 68 by an IEEE-488 interface bus 70. The computer is preferably a microvax such as the Vax II GPX workstation available from Digital Equipment Corporation and the results are output to a conventional CRT Display 72 or printer. The software of the present invention is preferably written in the Ada language, however, the "C" language, Fortran or any other language suitable for performing the calculations discussed herein can be used. The system preferably receives a complete spectrum from the digitizing analyzer 60 over the bus 70 as 1024 data words of 8 bits each although the invention could be used with higher resolution samples. The measurement sequence performed by the present invention starts by setting up the digitizing analyzer 60 based on the parameters discussed above describing the spectrum to be measured. These parameters are defined in terms of standard syntax as defined for such signals by standard IEEE-716-STD C/ATLAS incorporated by reference herein. During operation signal source 62 provides a signal to spectrum analyzer 60 for analysis. This analysis is performed by the spectrum analyzer 60 under control of the computer 68, using commands transmitted over bus 70. The digitized waveform of the signal characteristics determined by the spectrum analyzer 60 are then transmitted over bus 70 to computer 68 where further analysis is performed to provide descriptive parameters of the signal supplied by source 62.

The basic operation of spectrum analyzer 60 is well known to those of skill in the art and will not be described herein in great detail. Briefly, spectrum analyzer 60 obtains a plurality of amplitude measurements of the signal source 60 at different frequencies over a frequency interval defined by frequency limits supplied from the computer 68 or as set by the operator of the analyzer 60. These amplitude values are temporarily stored in spectrum analyzer 60 and may be displayed on the display screen integral with the spectrum analyzer 60. The amplitude values for the spectrum are transferred to the computer system 68 in response to commands from computer system 68. A more complete description of the construction and operation of the Hewlett Packard HP 8566A programmable spectrum analyzer is contained in the 8566A spectrum analyzer remote operation, manual (part no. 08566-9003 available from Hewlett Package Corporation.) Similarly, a more complete description of the construction and operation of the IEEE-488 interface bus is contained in a tutorial description of the Hewlett Packard bus interface also available from Hewlett Packard Corporation.

The digitized spectrum and associated parameters are read out of the analyzer 60 over the bus 70 in a DMA mode and passed to the analysis routine. The analysis routine sets up appropriate noise immunity filters based on the spectrum parameters and user specified hole characteristics discussed above.

The analysis routine then processes the digitized data and determines the approximate location of the bandwidth signal. This is accomplished by averaging the cells around the maximum to get a rough approximation of the zero dB reference. Then an approximate cutoff power is determined by subtracting the user specified cutoff power level (typically 3 dB) from this average. To determine the approximate location of the bandwidth, the algorithm walks in from the edges of the sample until the cutoff power is crossed. This provides a rough approximation of the actual bandwidth signal. This approximate location of the signal is used to provide bounds over which the signal power is again averaged (excluding signal values that fall within holes as specified by the allowable hole depth). This provides a more accurate zero dB reference than the previous average taken around the maximum. From this value we again subtract the cutoff power level and walk in from the edges to refine the starting and stopping points of the signal. Using the refined starting and stopping points, the system once again iterates the averaging function to converge on the zero dB reference. Although this convergence process is performed only twice, it is possible to continue averaging and edge walk-in until the value for the current zero dB reference is within some value, such as 1%, of the previously calculated value. This could provide more accurate spectrum measurements in some cases. The routine then determines the lower and upper cutoff frequencies and locates all holes in the spectrum.

The process of upper and lower cutoff frequency determination begins by determining the cutoff power level from the zero dB reference power previously determined. The process of locating the cutoff frequencies (the points where the signal power falls to the cutoff power) is more difficult and involves two techniques. In the first technique, the pointers are walked in from edges until the cutoff power level is met or exceeded. For nice clean spectrums this would be sufficient. However, to increase accuracy for noisy spectrums and to locate any holes, a second location technique is performed bounded by the first. The second technique starts at the maximum signal value and walks out to the edges until the cutoff points are located. During this process the routine characterizes each "possible" cutoff point to determine whether that particular point is a valid cutoff point or just part of a hole. All holes (as defined by the user parameters previously discussed) are counted, stored, and processed to determine the center frequency, depth, and width of each detected hole. In addition, to enhance immunity to noise at or near the cutoff frequency, the cutoff points that were located from technique one and technique two are averaged to determine the final cutoff frequencies. The bandwidth is calculated as the mathematical difference between these average upper and lower cutoff frequencies. Rather than a simple average it is of course possible to determine the final cutoff points from the two techniques by a weighted average or some other mathematical combination. After the cutoff points and holes have been accurately located, the minimum and maximum power points are located within the bandwidth signal including any holes that were previously located. The frequencies where the minimum and maximum power levels were located are saved and the ripple is calculated. Signal rejection is calculated by determining the difference between the zero dB reference power level and the baseline or noise floor of the signal. The noise floor is located by averaging the first and last 5% of the values in the sample, or a level can be specified by the user. When a level is specified by the user, all values less than the specified value will be included in the baseline average. The previously collected hole data is sorted and returned in frequency order (lowest to highest). Finally, all calculated data is returned.

A more detailed description of the specific implementation details of the present invention is provided below with respect to FIGS. 6-11. The description below in some cases, for brevity, only describes the software for processing one side (lower) of the spectrum and other side (upper) of the spectrum is processed using reverse logic. For example, when processing the lower or leading edge where the data pointer is decremented the upper side data pointer would be incremented. A person of ordinary skill in the art can appropriately reverse the logic.

Figure 6A:
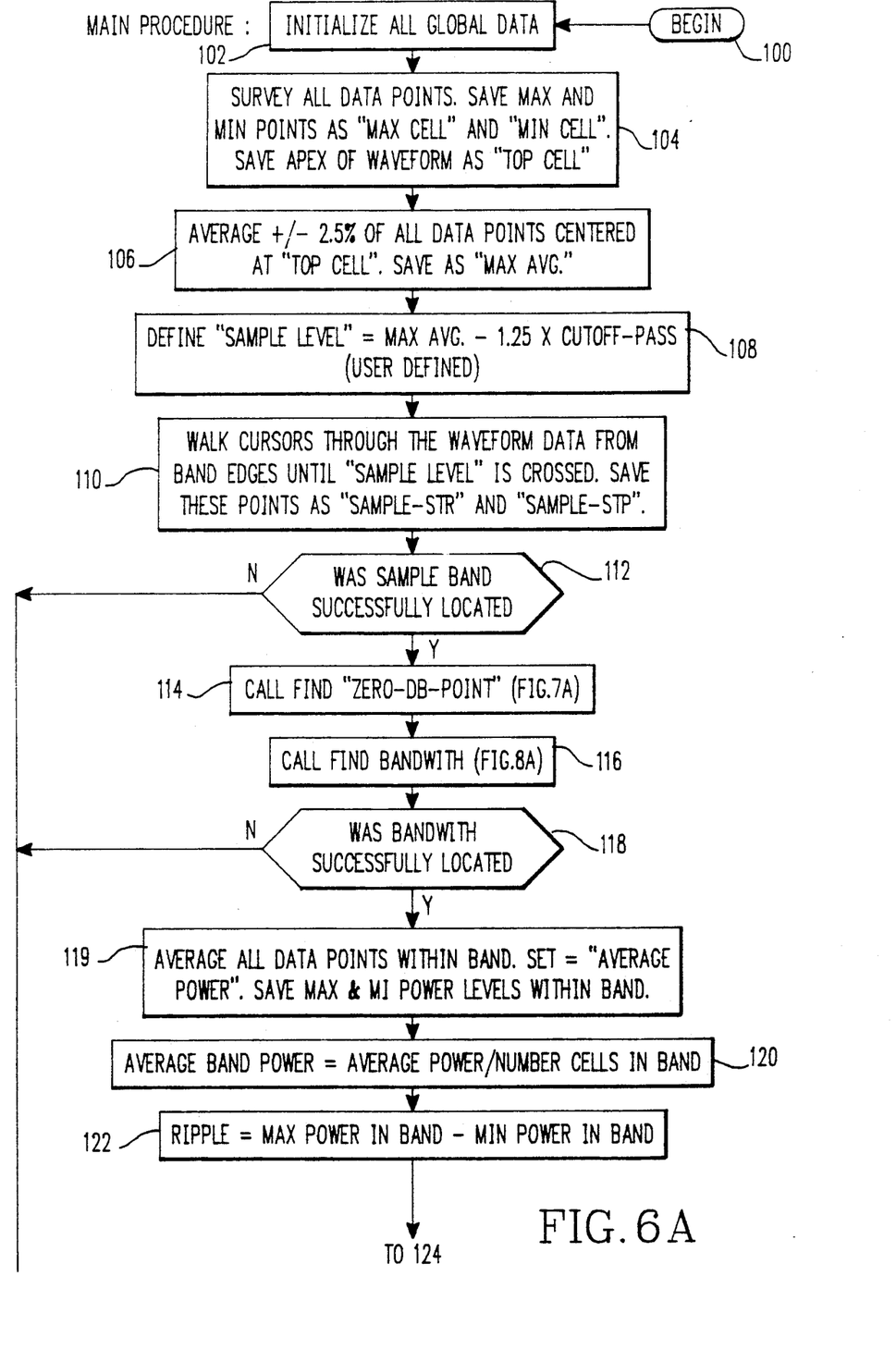
FIGS. 6A and 6B show a flowchart of the main control procedure of the present invention.
Figure 6B:
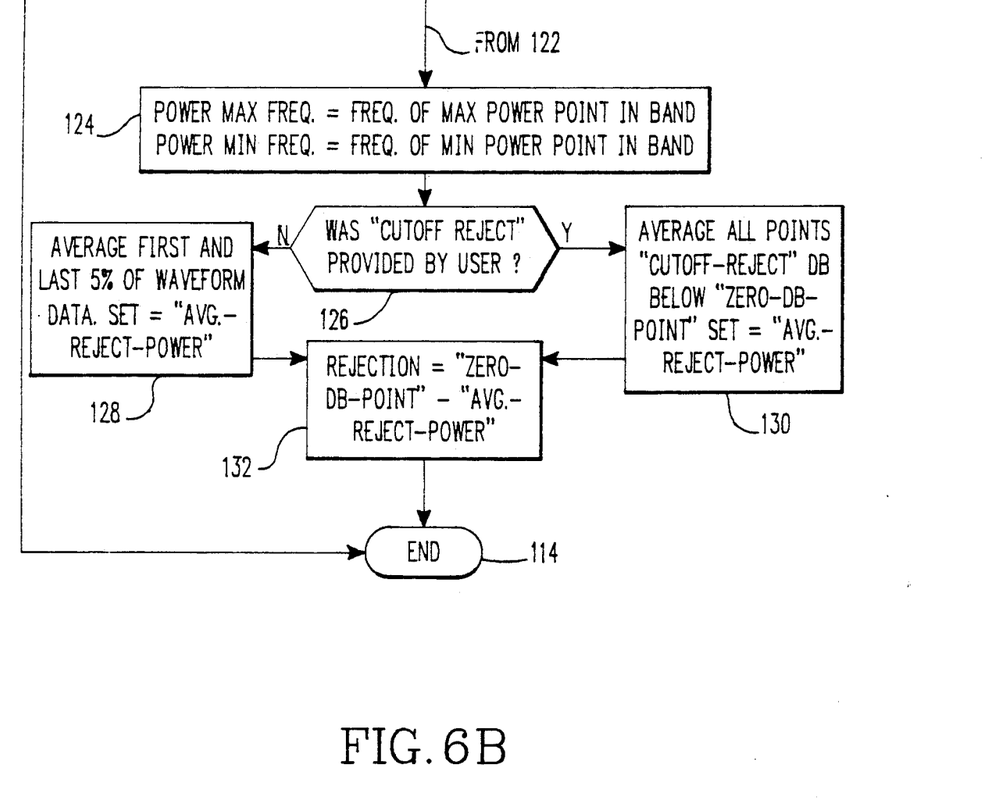

The main procedure of the present invention illustrated in FIG. 6 calculates the bandwidth of a spectrum given a digitized array of waveform data points. This procedure is essentially a series of calls to a number of procedures which return results which are then used to calculate the characteristics of the spectrum. This procedure starts by initializing all global data necessary for use by the various procedures. After initialization the data set is scanned 104 to determine the maximum and minimum points which are saved in maximum cell and minimum cell pointers. The system also saves either the maximum or the minimum pointer as the apex of the waveform depending on whether the spectrum being measured is a band-pass or band-reject spectrum as determined by the user parameter for this value previously input. Next the system averages 5% of the data point centered around the maximum 30 to produce a maximum average. Next a sample level is defined 108 and the data analysis pointers (in the flowchart called cursors) are incremented 110 through the waveform data from the edges, that is, from the beginning of the data and from the end of the data, until the sample level is found. The sample level coming in from the front of the data and from the rear of the data are saved as the sample start and sample stop values. The system then determines 112 whether the sample band was successfully located by determining whether there are sample start and stop values. If not, the routine stops having failed to locate a sample band. If the sample band is successfully located the system calls the find zero dB point routine illustrated in FIG. 7A and then calls the find bandwidth routine illustrated in FIG. 8A. Next, a determination 118 is made concerning whether the bandwidth has been successfully located this is simply checking a flag set by one of the routines to be discussed later. If not, once again the procedure terminates unsuccessfully. If the bandwidth has been located, the system calculates 119 the average power as the average of all datapoints within the band located and saves the power levels at the minimum and maximum pointers. Next the system calculates 120 the average band power followed by the ripple. The system then determines the frequency of the maximum power point and the frequency of the minimum power point from the maximum and minimum pointers discussed above. The system next determines 126 whether the user has provided a cutoff reject parameter. If not, the first and last 5% of the waveform data set are averaged to obtain the average reject power. If the user did provide a cutoff, the average of all points further away from the zero dB point than the cutoff reject parameter value provided by the user are averaged to determine the average reject power. Next, the rejection value is determined 132.

Figure 7A:
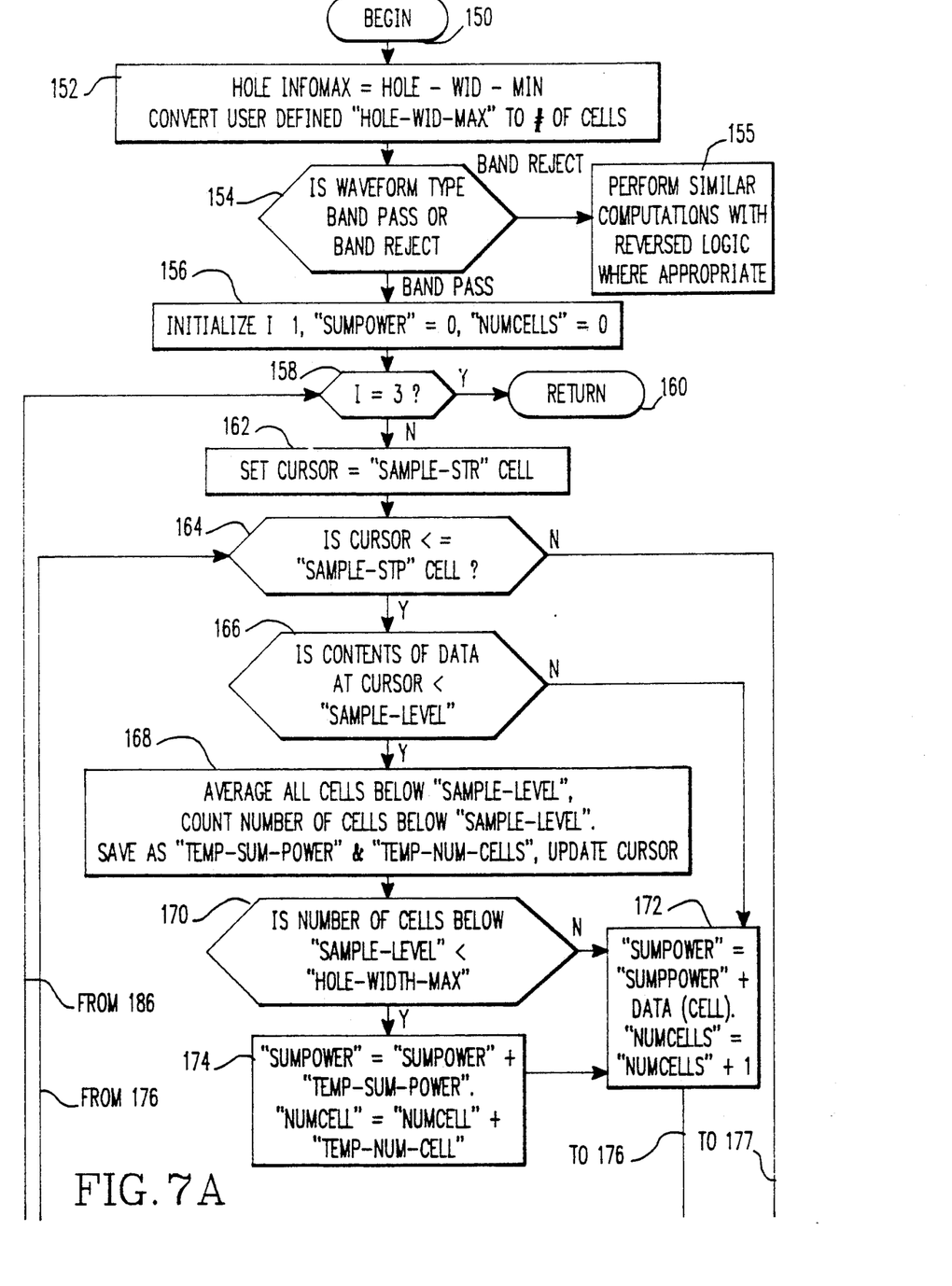
FIGS. 7A and 7B illustrate the find zero dB point routine of FIG. 6.
Figure 7B:
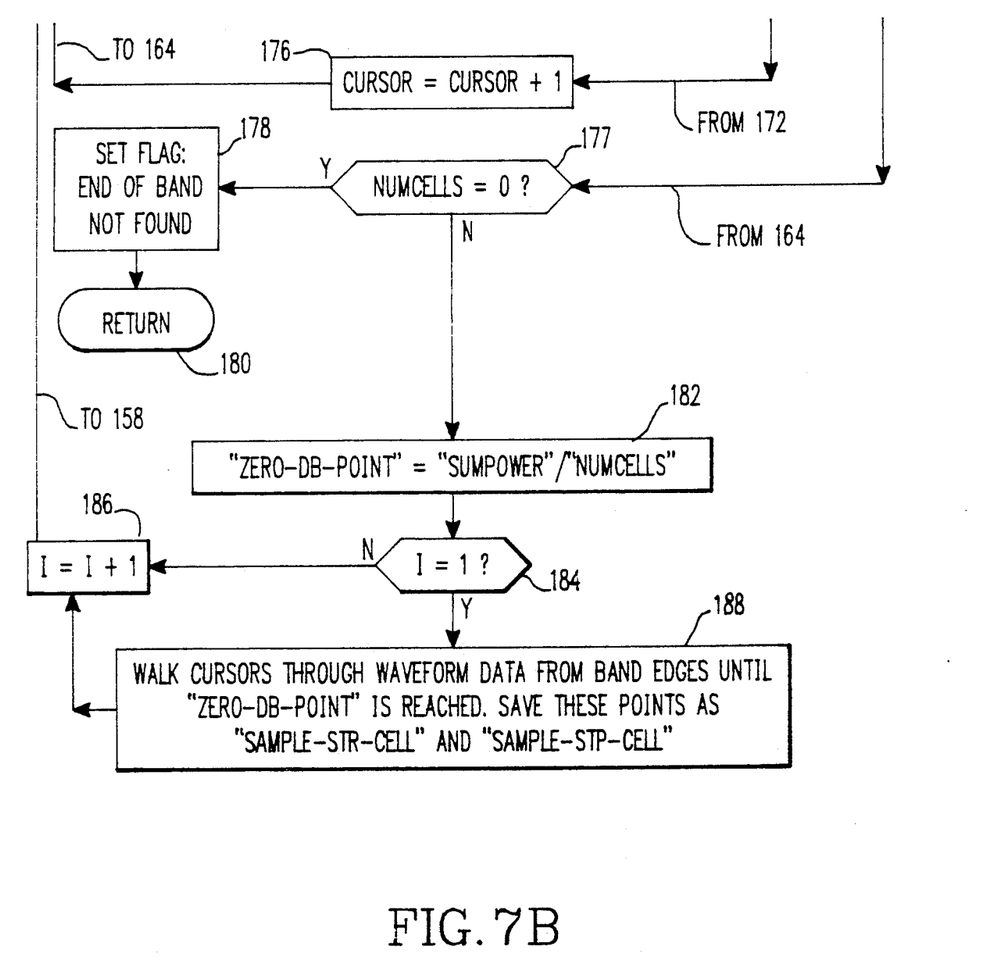

The find zero dB point routine of FIG. 7 begins by converting 152 the user defined hole width maximum into a number of data cells in the data set provided by the analyzer. This conversion is performed by dividing the hole width maximum, which is provided in cycles per second, by the number of cycles per second represented by each data cell. Once this conversion has been performed a determination 154 is made concerning whether the waveform is the band-pass or band-reject type waveform by checking the user input. If the waveform is the band-reject type waveform, the computations discussed below with respect to a band-pass spectrum are performed with reverse logic where appropriate. Next, an average parameter is initialized to one and parameters for storing the characteristics of a hole are initialized to zero. Then a determination is made 158 concerning whether the counter counting the number of averages is equal to three, if so, the system returns having found the zero dB point. If the required number of averages have not been performed, the data set sample cell pointer, called a cursor, is set to the sample start cell discussed in FIG. 6. Next, a data point is tested 164 against the sample stop cell to determine whether the end of the bandwidth of the spectrum has been reached. If the end has not been reached, then the data indicated by the cursor is tested 166 against the sample level. If the data is less than the sample level, indicating that it is outside the cutoff level set by the user or the default value by a certain distance, all of the cells that are below the sample level are averaged 168, counted and saved while the cursor is being updated. This step essentially saves the data points and the width of a possible hole in temporary storage until a determination can be made that this is indeed a hole. Once these temporary values have been determined, the saved number of data cells is tested 170 against the maximum hole width. This test is essentially performed to exclude from the average being calculated holes which would tend to drag the average down and therefore drag the correct zero dB point down to below where it should be. If the hole is bigger than the minimum value and should not be added into the average, then the data point pointed to by the updated cursor is added 172. If the possible hole is not small enough to qualify as a hole, then the temporary values are added 174 followed by adding 172 the value at the current cursor point. Next the cursor is updated and the loop continues. Once the sample stop cell is encountered, the value in the number of cells variable is tested 177. If this value is zero indicating that the stop value and start value are the same, then the end of band not found flag is set 178 followed by a return 180. If the number of cells value is not equal to zero then the zero dB point is set 182 as the average. Next the system tests 184 the average counter, updates it 186 and returns for another cycle. If this is the first average cycle as indicated by the test 184, the system scans 188 the data points from the beginning and from the end to locate new sample start and sample stop cell values for the boundaries of the bandwidth.

Figure 8A:
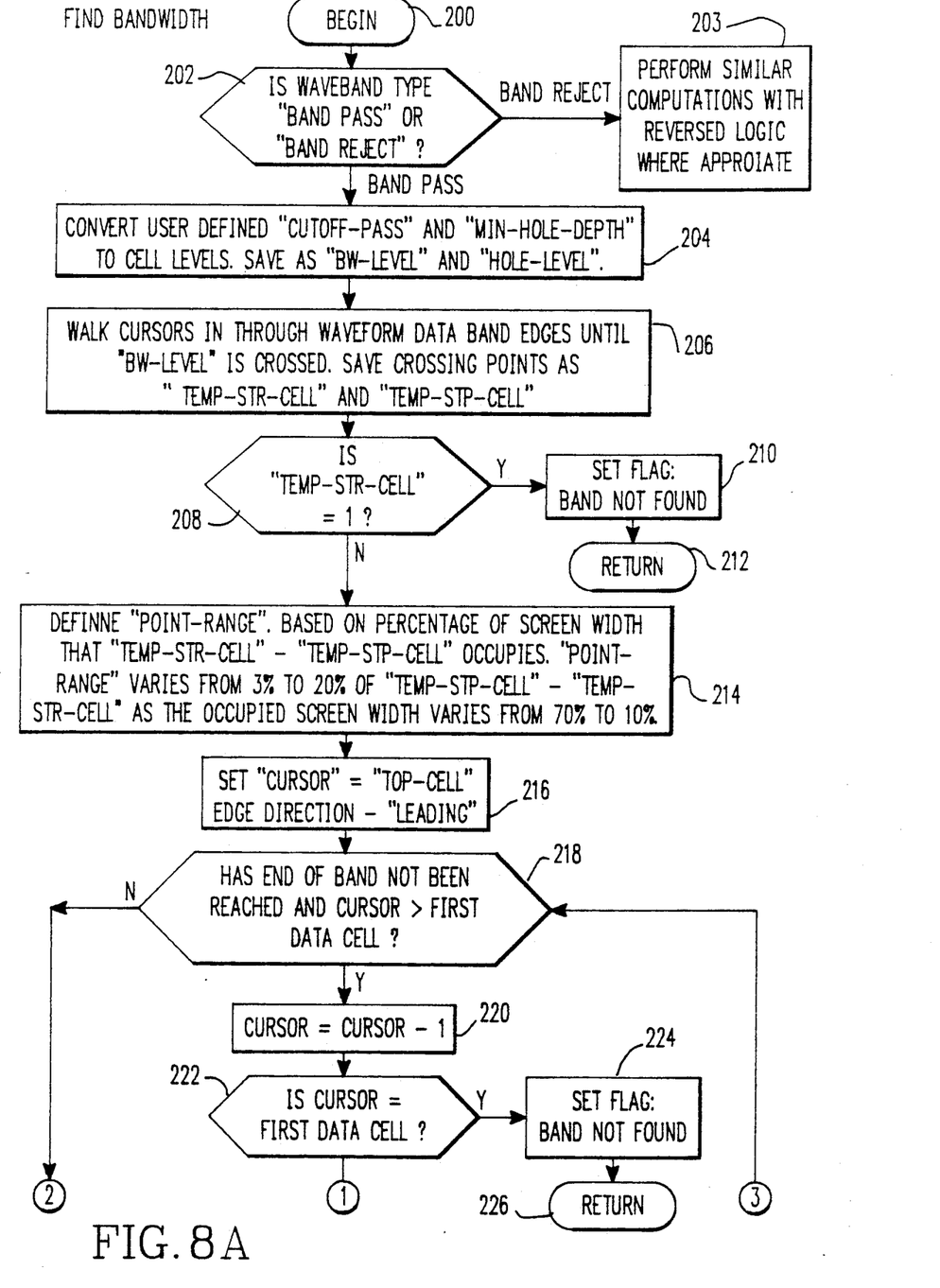
FIGS. 8A and 8B depict the find bandwidth procedure of FIG. 6.
Figure 8B:
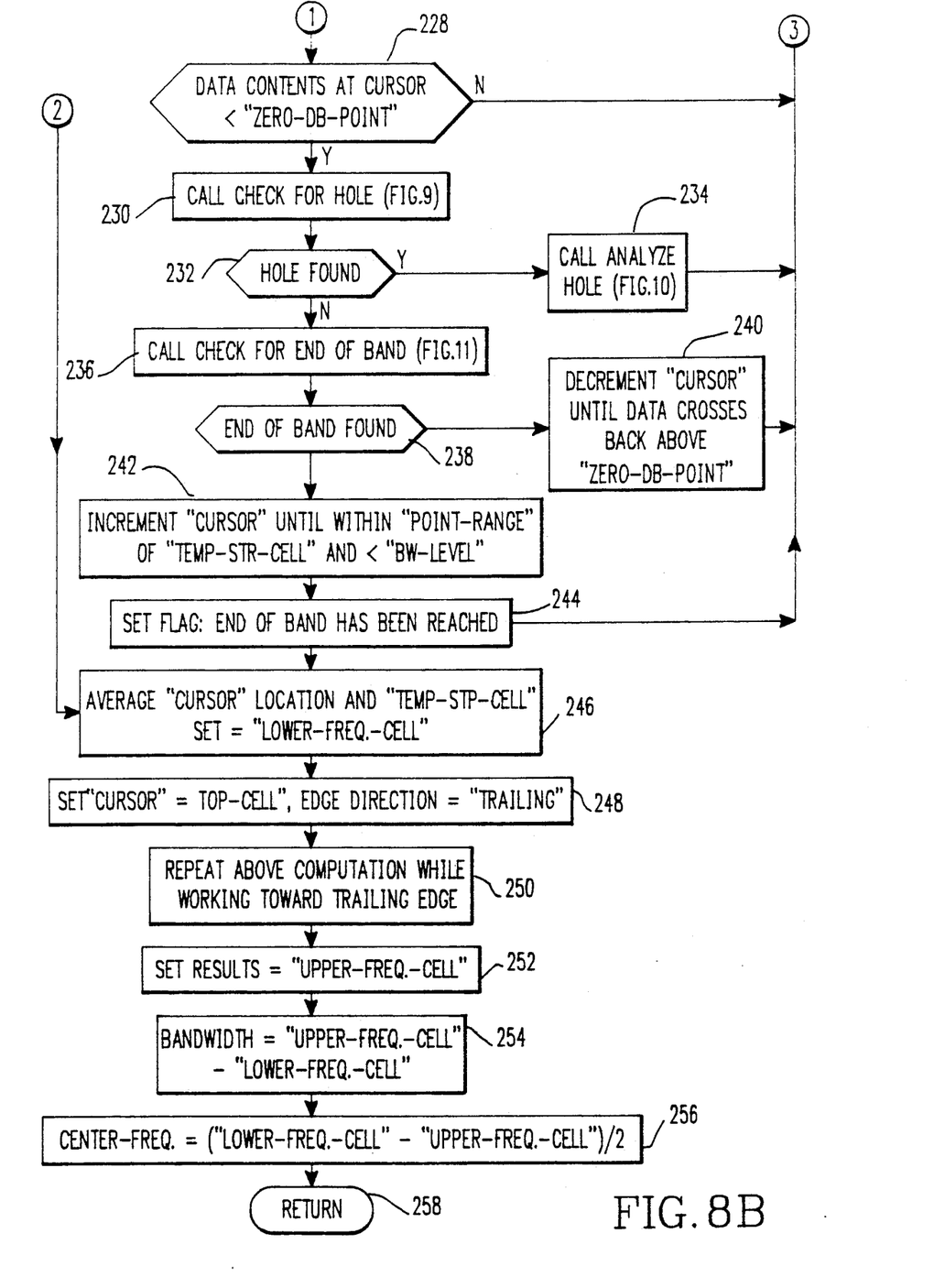
Figure 9:
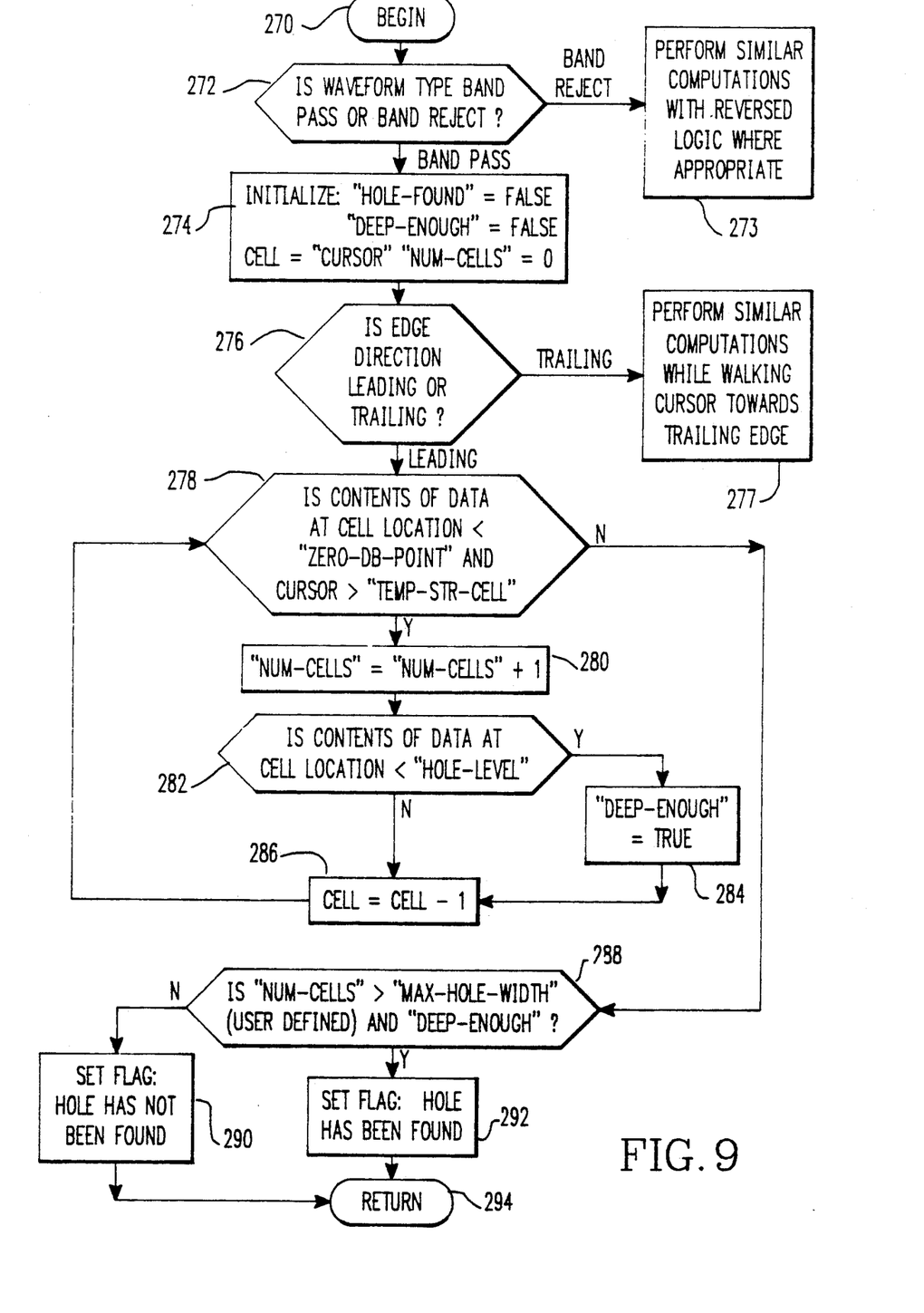
FIG. 9 is a flowchart of the check for hole routine of FIG. 8.
Figure 10:
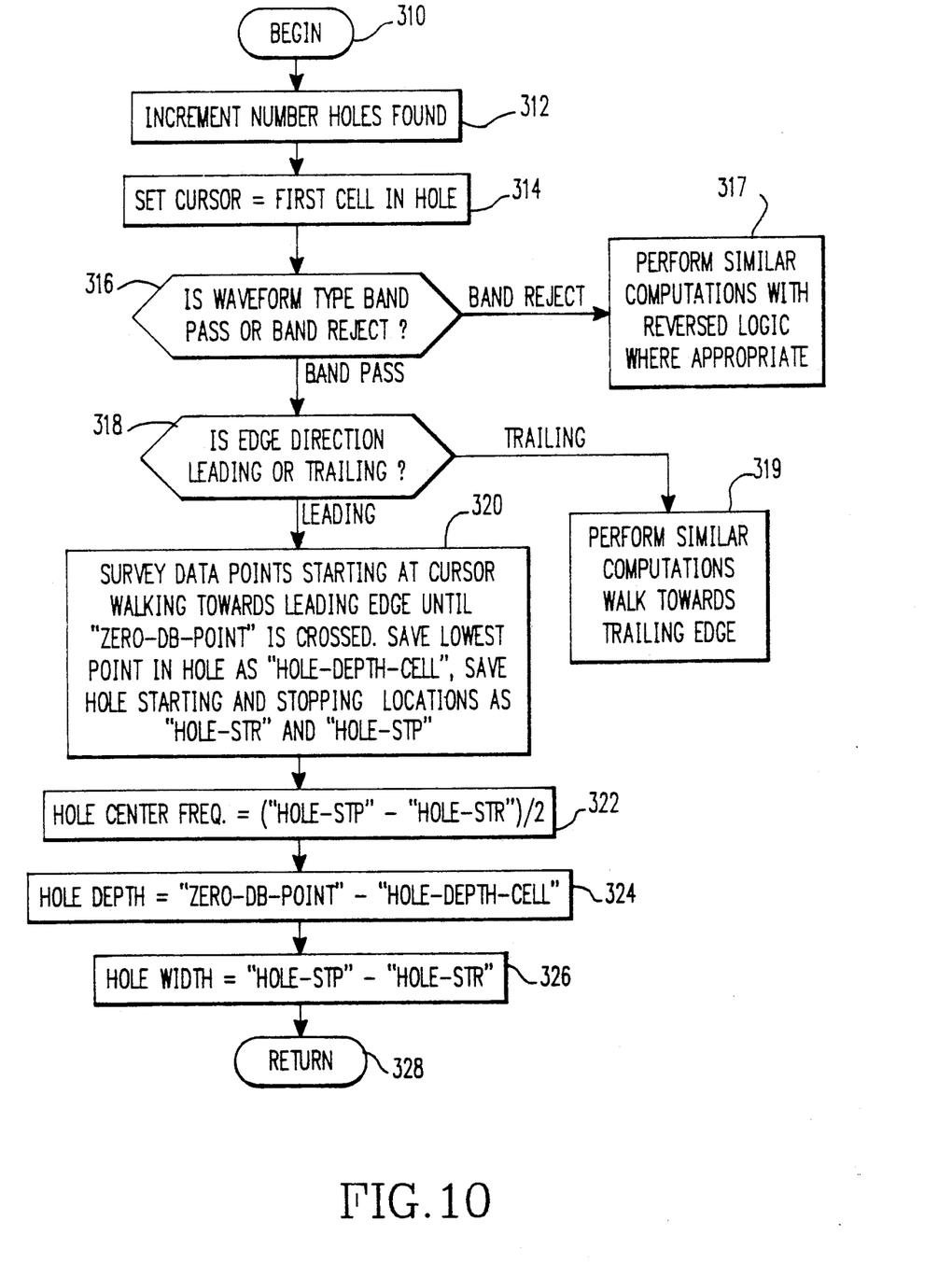
FIG. 10 depicts of the analyze hole routine of FIG. 8.
Figure 11:
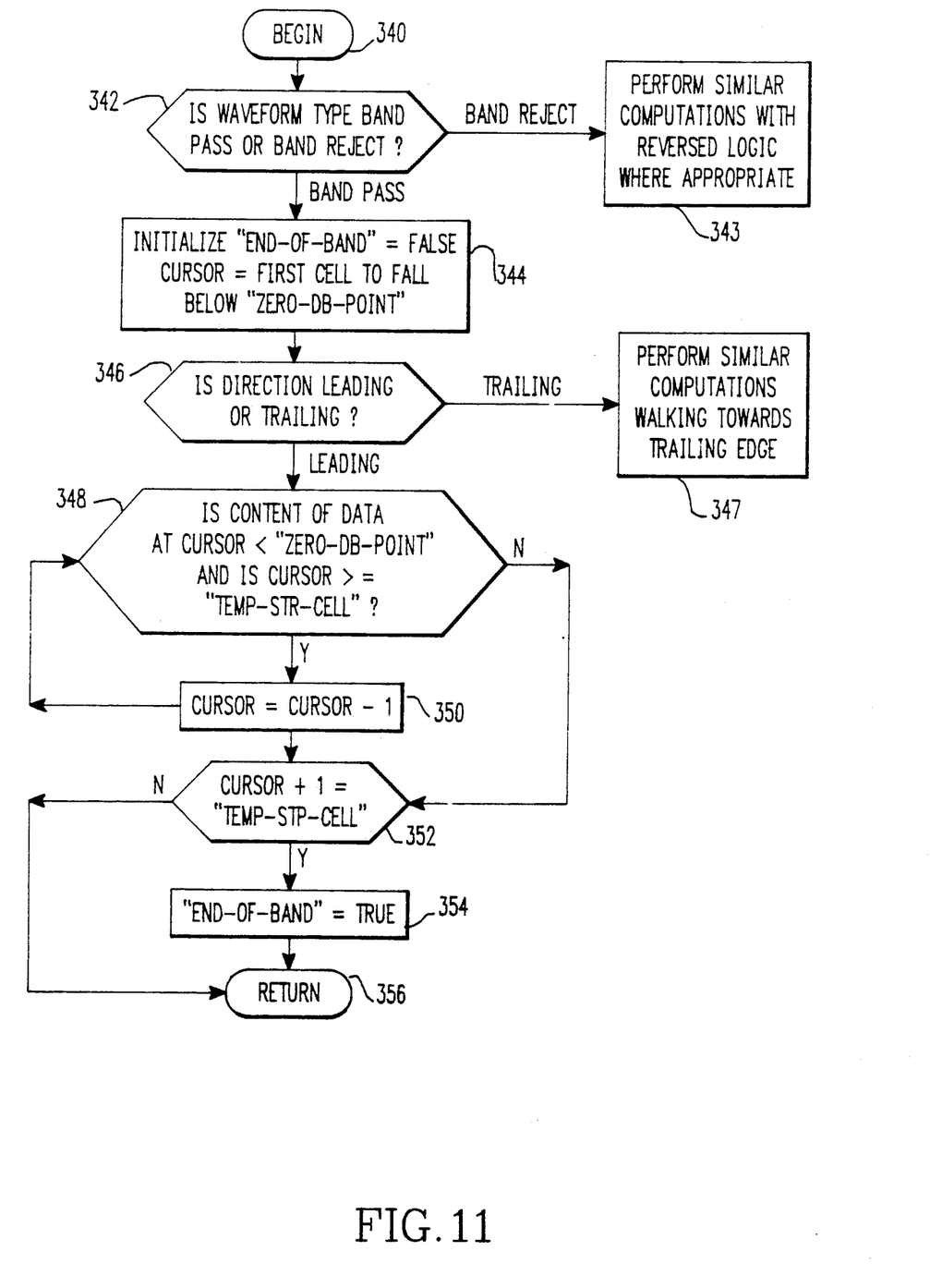
FIG. 11 illustrates the check for end of band routine of FIG. 8.
Figure 12:
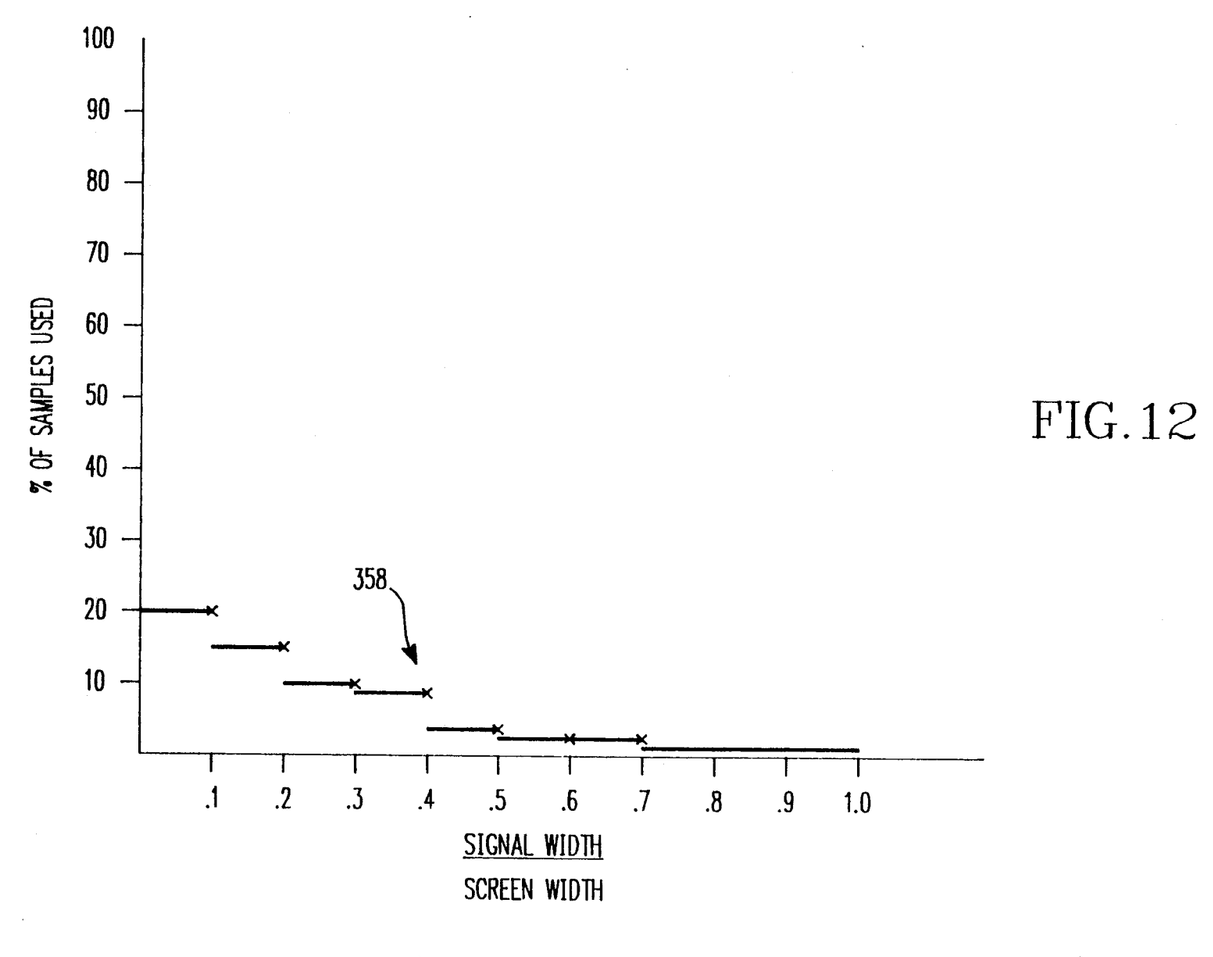
FIG. 12 is the curve used for determining a rejection range when locating the upper and lower cutoff frequencies in FIG. 8.

The find bandwidth routine illustrated in FIGS. 8A and 8B starts by performing the same waveform type test as previously discussed and then converts the user defined cutoff levels and minimum hole depth to cell levels and stores these values as bandwidth level and hole level. This is a conventional conversion process which converts the voltage values input by the user into number of cells by dividing the value input by the user by the number of cells per voltage increment. Once this conversion is performed the process scans 206 the waveform from the waveform databand edges until the bandwidth level value is crossed saving these values as the temporary starting and stopping bandwidth cell pointers. Next the temporary cell start pointer is tested 208 to determine whether it is equal to one and if so, the band not found flag is set 210 and the process returns. If the start cell is equal to 1 this indicates that there has been no bandwidth to measure. If the first cell is not the stop cell, then a point range is defined 214 based on the percentage of screen width occupied by the bandwidth where the point range value varies from 3% to 20% as the occupied screen width varies from 70% to 10%. The curve for this point range definition is illustrated in FIG. 12 and is essentially an exponential curve. This point range value is used to exclude as bandwidth end points oscillations or ringing type noise that occurs close to the actual bandwidth definition point. For example, if a candidate for an end point is outside the point range from the temporary start or stop cells, this candidate is ignored as the band end point. Once the point range is defined the cursor or pointer to the data being processed is set to the top cell and the edge direction is set toward leading. The process then starts a loop which moves the data point being processed out from the maximum point or top cell to the end of the bandwidth. This loop starts by testing 218 to determine whether the end of the band has not been reached and whether the cursor is greater than the first data cell. If this test is passed the cursor is decremented 220 and tested to determine whether the cursor is at the first data cell indicating that it has reached the beginning of the data. If the beginning of the data is reached, the flag indicating that the band has not been found is set 224 and a return occurs. If the cursor is not pointing at the first data cell the contents of the data cell is tested 228 against the zero dB point. If the contents is less than the zero dB point, the check for hole routine illustrated in FIG. 9 is called 230. If a hole has been found, then the call analyze hole routine of FIG. 10 is called. If a hole has not been found, the routine of FIG. 11 is called 236 to determine whether the end of the band has been reached. If the end of the band has not been reached, the cursor is decremented 240 to pass the hole, that is until the data value crosses back to or above the zero dB point level. If the end of the band has been found, then the cursor is decremented until it points to a value which is within the point range of the temporary start level and less than the bandwidth level. This stopping as soon as the value is within the point range of the temporary start level keeps the procedure from moving the pointer to the temporary start level position. Since the temporary start level position could be affected by noise and the position just detected could be affected by noise. the system selects two points for averaging which allow the noise to be filtered out. Next the end of band flag is set. When the end of band is reached, the test at step 218 is not passed and the cursor position and the temporary start cell are averaged and set as the low frequency cutoff point. As previously discussed, this could be a weighted average rather than a simple average. Next, the cursor is set to the top cell, and the edge direction is set as trailing 248 followed by a repeat of the above discussed steps 218-244, while incrementing the data pointer instead of decrementing, until the trailing edge point of the bandwidth is determined. Once this is located it is set 252 as the upper cutoff frequency. Next the bandwidth is calculated by subtracting the upper cutoff frequency from the lower cutoff frequency and the center frequency is determined 256 by an average of these two values.

The check for hole routine illustrated in FIG. 9 performs the same waveform type test 272 as previously discussed and then initializes 274 two flags and a hole width counter variable. Next, a determination is made 276 concerning whether the direction is leading or trailing by checking the flag. If the direction is trailing the same computation as discussed below are performed with appropriately reversed logic such as incrementing instead of decrementing. Next a test 278 is performed to determine whether the data at the cursor location is less than the zero dB level and whether the cursor is greater than the start cell which is the location of the band starting point determined in the walk-in from the beginning of the data. If this test is passed, then the number of cells in the hole is incremented 280. After the number of cells is incremented. a test 282 is performed to determine whether the data at the pointer is less than the hole level value and if so. the flag indicating that the hole is deep enough to qualify for a hole is set 286. Next, the data pointer is decremented. When the test 278 is not passed indicating that the data is no longer in the hole, the number of cells counted is compared to the maximum hole width and the deep enough flag is tested. If both of these tests are not passed, then the flag is set 290 to indicate that a hole has not been found otherwise the flag is set 292 to indicate that a hole has been found.

The analyze hole routine of FIG. 10 starts by incrementing 312 a number of holes found counter and setting 314 the cursor to the first cell in the hole which is the value of the cursor or data pointer when this routine is called from FIG. 8B. Then tests 316 and 318 as previously discussed for determining the type of waveform and the direction are performed. Next the system scans 320 the data points walking toward the leading edge until the zero dB point or level is crossed indicating that the end of the hole has been reached. During this process when the minimum point in the hole is detected, this location is saved as the hole depth cell and the hole starting and stopping locations are saved as the hole start and hole stop. Next the hole center frequency is calculated 322, the hole depth is calculated 324 and the hole width is calculated 326 and saved.

The check for end of band routine illustrated in FIG. 11 starts by performing the waveform type test 342 previously discussed. Next the end of band indicator is initialized 344 as false and the cursor is set at the first cell to fall below the zero dB point. This is the value of the cursor when this routine is called from FIG. 8B.

Next, the same test 346 for direction, as previously discussed, is performed followed by determining 348 whether the data at the pointer location is below the zero dB point and whether the pointer is still greater than the start point. If so, the cursor is decremented 350. When the test 348 is not satisfied a determination is made concerning whether the cursor has reached the starting cell. If so, then the end of band flag is set at true. If the test at 348 is not passed and the start cell as been reached, then a return occurs with the end of band flag set at false.

One way in which a particular hole within a spectrum can be characterized is to first use the invention to characterize a signal spectrum in a band-pass mode. Using the hole center frequency, depth and width characteristics the spectrum analyzer is set up to capture a narrower spectrum span around the specific hole. The invention then characterizes the more detailed spectrum in a band reject mode to measure the details of the specific hole.

The many features and advantages of the invention are apparent from the detailed specification and thus it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A bandwidth analysis system, comprising:
spectrum capture means for analyzing a signal and producing a frequency spectrum of the signal; and
analysis means, for determining a bandwidth of the spectrum, detecting a hole in the spectrum and determining characteristics of the hole in the spectrum.

2. A system as recited in claim 1, wherein said analysis means determines one of: a center frequency of the spectrum, upper and lower cut off frequencies of the spectrum, maximum power and a frequency at the maximum power, minimum power and a frequency at the minimum power, bandwidth ripple, bandwidth rejection, a baseline and average band power.

3. A system as recited in claim 1, wherein said analysis means determines one of: hole center frequency, hole width and hole depth.

4. A system as recited in claim 1, wherein said analysis means determines detects the hole by comparing spectrum data values with a minimum hole width and a minimum hole depth provided by a user.

5. A system as recited in claim 1, wherein said analysis means determines the bandwidth by scanning spectrum data inward from edges of the spectrum to determine outside leading and trailing edge cutoff points by comparing spectrum data to a cutoff level provided by the user, scanning the spectrum data outward from a maximum spectrum value point to determine inside leading and trailing edge cutoff points, averaging the inside and outside leading edge cutoff points and averaging the inside and outside trailing edge cutoff points.

6. A system as recited in claim 5, wherein said analysis means excludes as inside edge points data points outside a predetermined range from the outside edge cutoff points.

7. A system as recited in claim 1, wherein said analysis means excludes holes form zero level determination calculations during bandwidth determination.

8. A system as recited in claim 7, wherein said analysis means determines a zero level by averaging.

9. A bandwidth analysis system, comprising:
spectrum capture means for analyzing a signal and producing a frequency spectrum of the signal; and
analysis means for determining a zero reference level, a bandwidth and characteristics of a hole in the spectrum by detecting the hole by comparing spectrum data values with a minimum hole width and a minimum hole depth provided by a user, determining the bandwidth by scanning spectrum data inward from edges of the spectrum to determine outside leading and trailing edge cutoff points by comparing spectrum data to a cutoff level provided by the user, scanning the spectrum data outward from a maximum spectrum value point, while characterizing the holes, to determine inside leading and trailing edge cutoff points, averaging the inside and outside leading edge cutoff points and averaging the inside and outside trailing edge cutoff points, excluding as inside edge points data points outside a predetermined range from the outside edge cutoff points, and excluding holes from the zero level determination calculations during bandwidth determination.

10. A method of bandwidth analysis, comprising:
(a) capturing a spectrum of a signal;
(b) scanning the spectrum to find a reference level using a computer;
(c) determining, using the computer, a bandwidth from a predetermined cutoff level and the reference level and excluding spectrum holes from the bandwidth determination by detecting the holes; and
(d) calculating, using the computer, spectrum characteristics from the spectrum, the reference level and the bandwidth.

11. A method as recited in claim 10, wherein step (b) excludes spectrum holes from reference level determination.

12. A method as recited in claim 11, wherein holes are excluded by comparing spectrum data to a minimum hole width and a minimum hole depth.

13. A method as recited in claim 10, wherein holes in the spectrum are counted and characterized.

14. A method as recited in claim 10, wherein step (b) comprises:
(1) averaging a predetermined number of data points around a spectrum apex;
(2) determining a first level from the average,
(3) scanning the spectrum from the edges to find first leading and trailing edge points where the data points cross the first level;
(4) averaging the data points between the first leading and trailing edge points as a second level;
(5) scanning the spectrum from the edges to find second leading and trailing edge points where the data points cross the second level; and
(6) averaging the data points between the second leading and trailing edge points as the reference level.

15. A method as recited in claim 10, wherein step (c) comprises:
(1) determining a cutoff value from the reference level and the predetermined cutoff level;
(2) scanning the spectrum from the edges inward to find outside leading and trailing edge points where spectrum data points cross the cutoff value;
(3) scanning the spectrum from a spectrum apex outward to find inside leading and trailing edge points within a predetermined range of the outside leading and trailing edge points where the spectrum data points cross the cutoff value;
(4) averaging the inside and outside leading edge points and averaging the inside and outside trailing edge points; and
(5) subtracting the averaged leading and trailing edge points.

16. A method as recited in claim 11, wherein hole exclusion comprises:
(1) scanning the spectrum to determine . hole depth and hole width and saving hole width and value data;
(2) comparing the hole width data and value data to a hole minimum width and a hole minimum depth; and
(3) combining the saved hole width and value data with reference level data when the comparison indicates a hole does not exist.

17. A method as recited in claim 13, wherein hole counting and characterization comprise:
(1) scanning the spectrum to determine hole depth and hole width and saving hole width and value data;
(2) comparing the hole width data and value data to a hole minimum width and a hole minimum depth; and
(3) determining hole width, hole depth and hole center frequency from the saved hole width and value data when the comparison indicates a hole exists.

18. A method of measuring a hole in a spectrum, comprising:
(a) capturing a spectrum of a signal;
(b) scanning the spectrum to detect the hole and determine location and size characteristics of the hole in the spectrum using a computer;
(c) capturing a narrower span of the spectrum around the located hole; and
(d) scanning the narrower span of the spectrum determining cutoff levels and a bandwidth of the located hole using the computer.

19. A system as recited in claim 1, wherein said analysis means comprises a computer.

20. A system as recited in claim 9, wherein said analysis means comprises a computer.

21. A system as recited in claim 1, wherein said analysis means detects the hole by using a minimum hole size.

22. A system as recited in claim 9, wherein said analysis means detects the hole by using a minimum hole size.

23. A method as recited in claim 10, wherein step (c) detects the holes using a minimum hole size.

24. A method as recited in claim 18, wherein step (b) detects the holes using a minimum hole size.

* * * * *